(12) United States Patent
Huisman et al.

(10) Patent No.: US 10,527,959 B2
(45) Date of Patent: Jan. 7, 2020

(54) POSITION SENSOR, LITHOGRAPHIC APPARATUS AND METHOD FOR MANUFACTURING DEVICES

(71) Applicant: ASML NETHERLANDS B.V., Veldhoven (NL)

(72) Inventors: Simon Reinald Huisman, Eindhoven (NL); Simon Gijsbert Josephus Mathijssen, Rosmalen (NL); Sebastianus Adrianus Goorden, Eindhoven (NL); Duygu Akbulut, Eindhoven (NL); Alessandro Polo, Arendonk (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/325,471

(22) PCT Filed: Jun. 30, 2017

(86) PCT No.: PCT/EP2017/066321
§ 371 (c)(1),
(2) Date: Feb. 14, 2019

(87) PCT Pub. No.: WO2018/041440
PCT Pub. Date: Mar. 8, 2018

(65) Prior Publication Data
US 2019/0212658 A1 Jul. 11, 2019

(30) Foreign Application Priority Data
Aug. 30, 2016 (EP) .................................... 16186333

(51) Int. Cl.
*G03F 7/20* (2006.01)
*G03F 9/00* (2006.01)
(Continued)

(52) U.S. Cl.
CPC ........ *G03F 9/7046* (2013.01); *G03F 7/70141* (2013.01); *G03F 9/70* (2013.01);
(Continued)

(58) Field of Classification Search
None
See application file for complete search history.

(56) References Cited

U.S. PATENT DOCUMENTS

| 4,710,026 A | 12/1987 | Magome et al. |
| 4,814,829 A | 3/1989 | Kosugi et al. |

(Continued)

FOREIGN PATENT DOCUMENTS

| TW | 201233994 | 8/2012 |
| TW | 201337246 | 9/2013 |

(Continued)

OTHER PUBLICATIONS

International Search Report and Written Opinion issued in corresponding PCT Patent Application No. PCT/EP2017/066321, dated Sep. 13, 2017.

(Continued)

*Primary Examiner* — Michelle M Iacoletti
(74) *Attorney, Agent, or Firm* — Pillsbury Winthrop Shaw Pittman LLP

(57) ABSTRACT

An alignment sensor for a lithographic apparatus has an optical system configured to deliver, collect and process radiation selectively in a first waveband (e.g. 500-900 nm) and/or in a second waveband (e.g. 1500-2500 nm). The radiation of the first and second wavebands share a common optical path in at least some portion of the optical system, while the radiation of the first waveband is processed by a first processing sub-system and the radiation of the second waveband is processed by a second processing sub-system. The processing subsystems in one example include self- (Continued)

referencing interferometers. The radiation of the second waveband allows marks to be measured through an opaque layer. Optical coatings and other components of each processing sub-system can be tailored to the respective waveband, without completely duplicating the optical system.

20 Claims, 5 Drawing Sheets

(51) Int. Cl.
  *G02B 5/20* (2006.01)
  *G02B 5/30* (2006.01)

(52) U.S. Cl.
  CPC .......... *G03F 9/7003* (2013.01); *G03F 9/7049* (2013.01); *G03F 9/7065* (2013.01); *G02B 5/208* (2013.01); *G02B 5/3083* (2013.01)

(56) References Cited

U.S. PATENT DOCUMENTS

| | | | |
|---|---|---|---|
| 5,148,214 | A | 9/1992 | Ohta et al. |
| 5,859,707 | A | 1/1999 | Nakagawa et al. |
| 6,100,987 | A | 8/2000 | Kawakubo |
| 6,285,455 | B1 | 9/2001 | Shiraishi |
| 6,961,116 | B2 | 11/2005 | Den Boef et al. |
| 2001/0026357 | A1 | 10/2001 | Ota et al. |
| 2004/0033426 | A1 | 2/2004 | Den Boef et al. |
| 2006/0115956 | A1 | 6/2006 | Raval et al. |
| 2007/0242271 | A1 | 10/2007 | Moon |
| 2009/0153825 | A1 | 6/2009 | Edart et al. |
| 2009/0195768 | A1 | 8/2009 | Bijnen et al. |
| 2010/0195102 | A1 | 8/2010 | Den Boef |
| 2011/0033790 | A1 | 2/2011 | Mishima |
| 2014/0111788 | A1 | 4/2014 | Maeda |
| 2014/0146297 | A1 | 5/2014 | Vainer et al. |
| 2015/0355554 | A1 | 12/2015 | Mathijssen |
| 2017/0242343 | A1* | 8/2017 | Pandey .............. G01N 21/4788 |

FOREIGN PATENT DOCUMENTS

| | | |
|---|---|---|
| WO | 2013117448 | 8/2013 |
| WO | 2014066679 | 5/2014 |
| WO | 2015051970 | 4/2015 |

OTHER PUBLICATIONS

Lee, et al.: "Interrogation techniques for fiber grating sensors and the theory of fiber gratings", Fiber Optic Sensors, Marcel Deckker, Inc. 2002, pp. 295-381.

Taiwanese Office Action issued in corresponding Taiwanese Patent Application No. 106125006, dated Jan. 31, 2019.

* cited by examiner

POSITION SENSOR, LITHOGRAPHIC APPARATUS AND METHOD FOR MANUFACTURING DEVICES

BACKGROUND

Cross-Reference to Related Applications

This application is the U.S. national phase entry of PCT patent application no. PCT/EP2017/066321, which was filed on Jun. 30, 2017, which claims the benefit of priority of European patent application no. 16186333.7, which was filed on Aug. 30, 2016, and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates more particularly to position sensors and methods for determining the position of a mark on a substrate.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately.

Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO2015051970A1 (Tinnemans et al). The contents of all of these publications are incorporated herein by reference.

As soon as new layers are applied on top of the layer containing the alignment marks, the problem arises that position signals obtained using the position sensor are impaired or unobtainable. The mark structure itself may also become distorted by the chemical and physical processes applied after the formation of the alignment marks. Many developments and improvements have been made in such position sensors, to improve measurement accuracy under a range of conditions. Additional marks can be formed in subsequent layers, to be used where the original marks are obscured. In some processes, however, a new material layer must be deposited which simply obscures the alignment marks to the extent that their position cannot be determined. An example of such a material is amorphous carbon. In order to position accurately device patterns in such a layer, it is generally required to cut openings in the layer to reveal the underlying alignment marks. These windows can be relatively coarsely positioned, but the accuracy required still presupposes some method to determine the position of the underlying marks. Accordingly, different methods have been devised to ensure that some identifiable marks are visible in the opaque layer for example by forming topographical features prior to deposition of the opaque layer material. Such methods involved additional steps and expense, as well as occupying additional space ("real estate") on the substrate.

SUMMARY OF THE INVENTION

The present invention in a first aspect aims to allow the position of a mark to be determined despite the presence of an overlying structure, without the need for costly additional pattering and processing steps.

The invention in a first aspect provides a position sensor comprising an optical system configured to deliver radiation to an alignment mark on a substrate and to collect diffracted or scattered radiation from the substrate, and to process the collected radiation to derive at least one position-sensitive signal therefrom, wherein the optical system is operable to deliver, collect and process radiation selectively in a first wavelength range and/or in a second wavelength range, wherein the radiation of the first wavelength range and the second wavelength range share a common optical path in at least some portion of said optical system, while the radiation of the first wavelength range is processed by a first processing sub-system and the radiation of the second wavelength range is processed by a second processing sub-system.

By using radiation in a second waveband, the disclosed sensor allows marks to be measured through a layer which is opaque to the radiation in a first waveband. By providing separate processing sub-systems, optical coatings and other components of each processing sub-system can be tailored to the respective waveband, allowing a much wider range of wavelengths to be used than in known sensors. The provision of a common portion of the optical path avoids completely duplicating the optical system.

In an embodiment the first wavelength range includes radiation with a wavelength shorter than 800 nm and said second wavelength range includes infrared radiation with wavelength longer than 1000 nm, in another embodiment longer than 1500 nm and in yet another embodiment longer than 2000 nm.

In an embodiment the optical system includes an illumination system for combining radiation of both the first and second wavelength ranges from one or more radiation sources into said common optical path and said common optical path further includes a common objective lens for delivering and collecting said radiation of both the first and second wavelength ranges to the alignment mark, the objective lens being included in said common optical path. In a further embodiment a spectral filter is provided to split the radiation of the first and second wavelength ranges collected by said common objective lens for delivery to the first and second processing sub-systems. In another further embodiment a first half or quarter wave plate is positioned in the path of the radiation of the first wavelength range between said spectral filter and the first interferometric subsystem, and a second half or quarter wave plate is positioned in the path of the radiation of the second wavelength range between said spectral filter and the second interferometric subsystem.

In an embodiment the optical system includes a first objective lens for delivering and collecting radiation of the first wavelength range and a second objective lens for delivering and collecting radiation of the second wavelength range. In a further embodiment the optical system includes an illumination system for combining radiation of both the first and second wavelength ranges from a plurality of radiation sources into said common optical path for delivering radiation to the first and second objective lenses. In yet another embodiment a spectral filter is provided to split the radiation of the first and second wavelength ranges from said common optical path for delivery to the first and second objective lenses.

In an embodiment a plurality of position-sensitive signals are obtained by processing the collected radiation in at least one of said wavelength ranges, each position-sensitive signal being obtained using radiation having different characteristics. In an embodiment the radiation having different characteristics includes radiation having different wavelengths within said first wavelength range. In an embodiment the radiation having different characteristics includes radiation having different wavelengths within said second wavelength range. In an embodiment the radiation having different characteristics includes radiation having different polarizations.

The processing subsystems in one example comprise self-referencing interferometers, similar to those described in the patent publications referenced above. Another type of interferometer and non-interferometric type of position sensing processing sub-system can be used instead of a self-referencing interferometer, in one or both of the processing sub-systems.

The invention further provides a method of manufacturing devices wherein a device pattern is applied to a substrate using a lithographic process, the method including positioning the applied pattern by reference to measured positions of one or more marks formed on the substrate, the measured positions being obtained using a position sensor according to the invention as set forth above.

In one embodiment of the method, different device patterns are applied to different layers on the substrate, and wherein said measured positions are obtained using the first wavelength range for patterning a first layer and using the second wavelength range for a second layer.

In an embodiment the pattern is applied to a layer of carbon hard mask, the measured positions being obtained using the second wavelength range.

The invention further provides a lithographic apparatus for use in applying a pattern to a substrate, the lithographic apparatus including a position sensor according to the invention and a controller configured for causing the position sensor to measure the position of one or more alignment marks using a radiation in a selected one or both of said wavelength ranges, and for using the measured position of the target structure to control the positioning of one or more patterns applied to the substrate.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
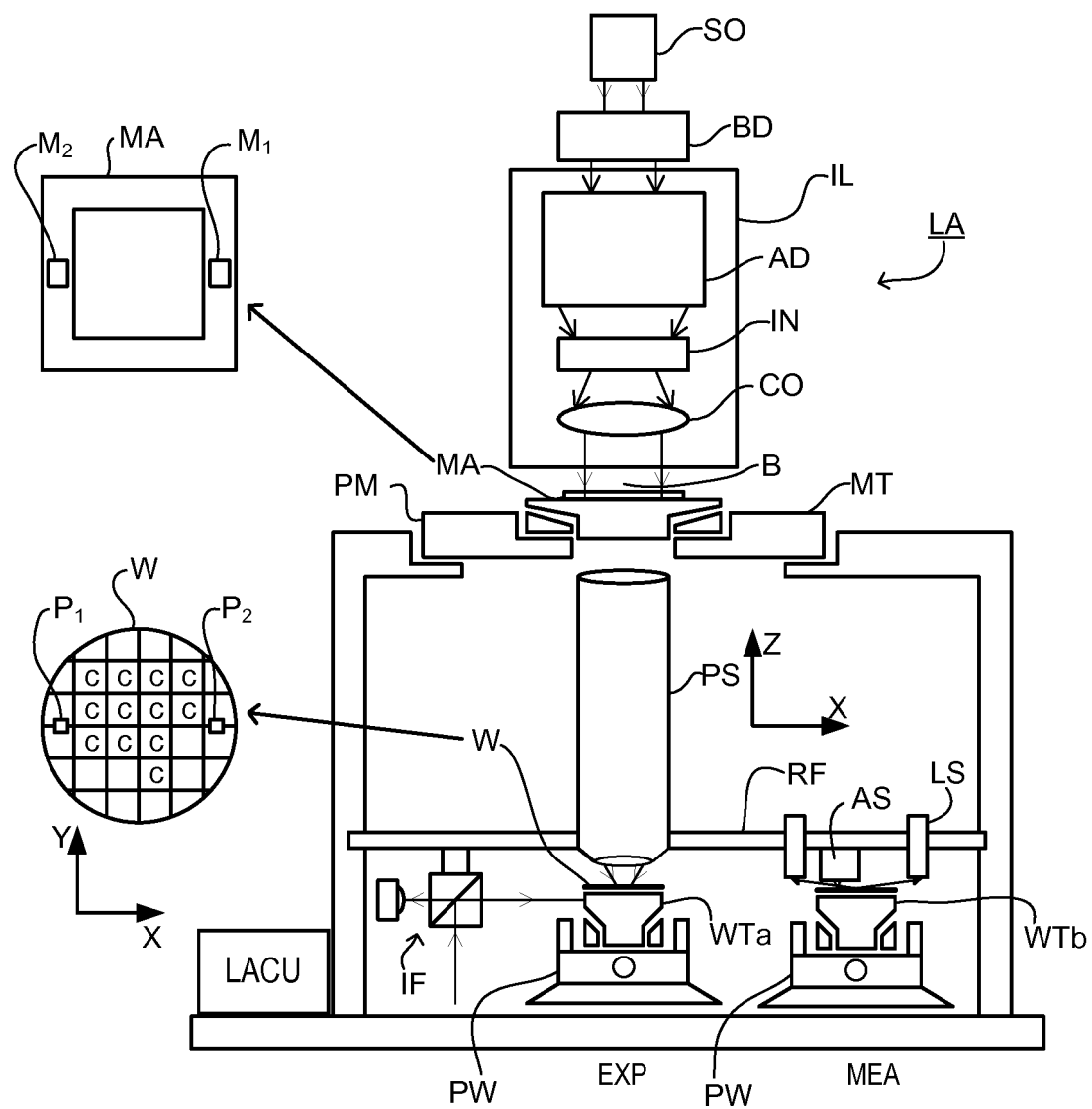
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
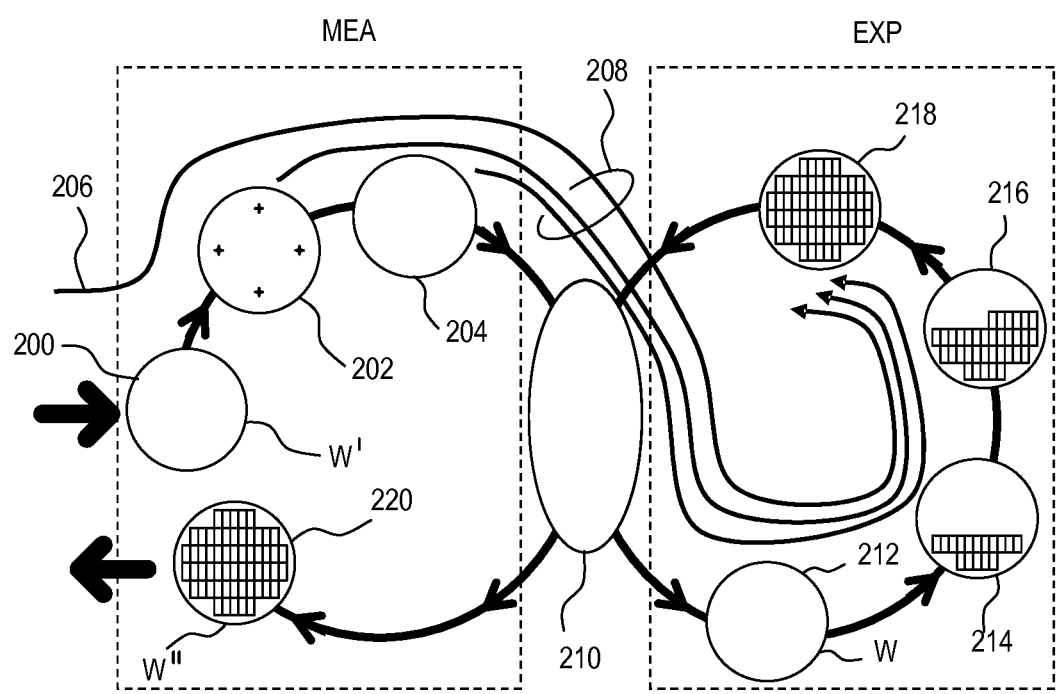
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. Within a dotted box on the left hand side of FIG. 2 process steps are performed at a measurement station MEA, while the right hand side of FIG. 2 shows process steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding in these parameters. Therefore some layers may be exposed in an immersion type lithography tool, while others are exposed in a 'dry' tool. Some layers may be exposed in a tool working at DUV wavelengths, while others are exposed using EUV wavelength radiation.

At 202 alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204 a map of wafer height (Z) against X-Y position is measured using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. The measurements of wafer position, wafer grid and height map, that were performed at steps 202, 204, are added to these recipe data so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210 the substrates W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212 reticle alignment is performed using mask alignment marks M1, M2. In steps 214, 216 and 218 scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In some processes, processing of layers on the substrate after the alignment mark has been formed leads to situations in which the marks cannot be found by the alignment sensor due to low or no signal strength. A low or zero signal strength can be caused for example by opaque layers on top of the marks which block the operation of the alignment sensor.

Figure 3:
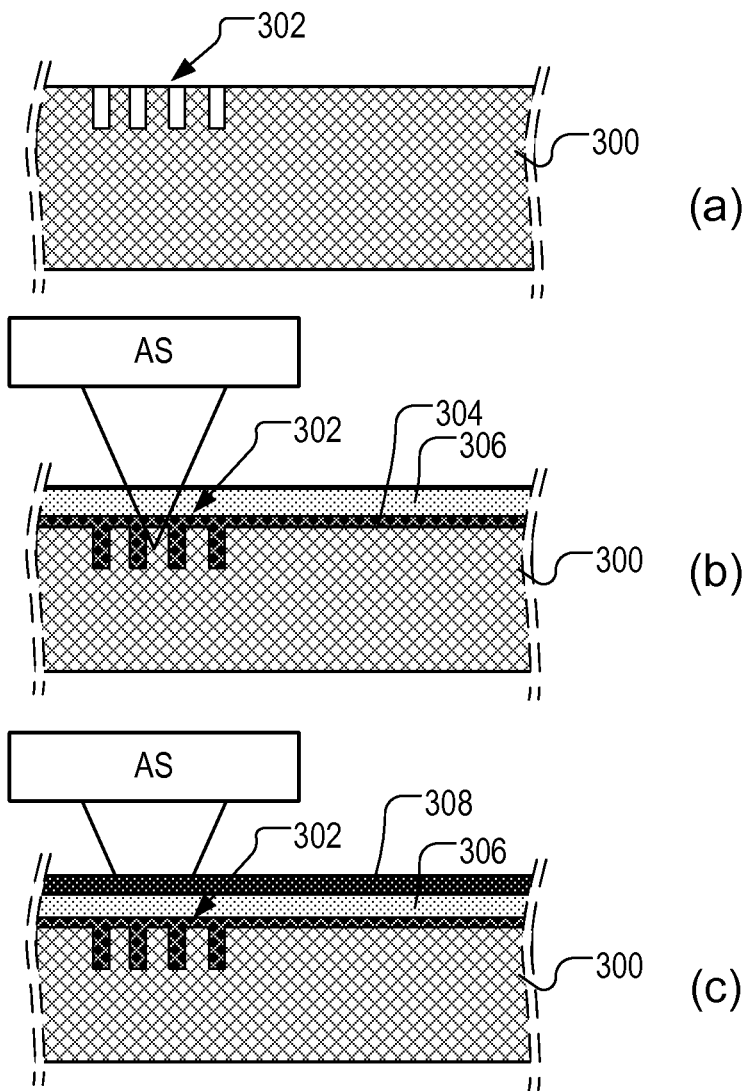
FIG. 3 illustrates schematically the use of a position sensor to measure the position of a target structure formed on a substrate, and a problem of an opaque overlying structure.

FIG. 3 illustrates the problem (all features in these drawings are shown schematically, and not to scale). A portion of the substrate is shown in cross-section at 300. FIG. 3(*a*) shows the condition of the substrate when a grating structure has been formed to function as an alignment mark 302. It will be understood that this mark 302 is merely one of a plurality of marks present across the substrate. Different types of marks may be provided, to suit different sensors and/or different process conditions. Different marks may be provided for coarse position measurements and fine position measurements. Features defining the grating structure have been applied to the blank material of the substrate using the lithographic apparatus LA or a similar apparatus to form a pattern in a resist layer, and then chemically or physically etching the applied pattern to form trenches and in this way define the permanent grating structure in the blank material. These trenches may subsequently become filled with a material of another layer 304. The patterning to form the grating structure may be performed as part of a first layer processing of the substrate, in which the same patterning step also applies first layer device features. Alternatively, in some processes, it is preferable to form the alignment mark 302 in a dedicated step, which may be referred to as "layer 0".

As seen at (b), alignment sensor AS in the lithographic apparatus can be used to detect the position of the mark 302, even as it becomes buried under overlying structures such as material layers 304 and 306. The known alignment sensors described in the references generally offer the capability to detect the position of the mark 302 using different wavelengths of radiation, so as to penetrate typical overlying structures. On the other hand, some materials used in the construction of the device may be opaque to any of the radiation available for use in the alignment sensor. At (c) in FIG. 3, a particular layer 308 has been added. This may be, for example, a carbon hard mask layer. Layer 308 is applied in preparation for imparting a pattern to it, to form a functional layer of the device, or to form a hard mask for etching the layer below. However, layer 308 is opaque to the radiation of the alignment sensor AS, using the conventional range of wavelengths.

In case opaque layer 308 also does not leave any topographic features by which the mark may be found, accurate positioning of the pattern to define features in the opaque layer 308 becomes impossible without additional measures. For example, it is known to produce additional marks in subsequent layers to facilitate mark detection. However, the production of these additional marks is expensive. Some processes rely on the production of an optical window on top of the existing marks, in such a way that only the material which is located on top of the marks is removed and therefore the marks can be measured. The opening of the optical window allows alignment sensor AS to read the position of the mark 302, so that the lithographic apparatus can accurately position a subsequent pattern on the opaque layer 308. This optical window, also known as "clear-out", needs to be done with a certain positional accuracy, otherwise die yield will be affected by cutting out parts of the layer which are needed to remain, in order to have a functional device. By modifying the topography of the layer beneath the opaque layer 308, it is possible to provide alignment marks which can be read accurately enough to allow positioning of the clear-out windows. However, these also require additional processing steps and expense.

Figure 4:
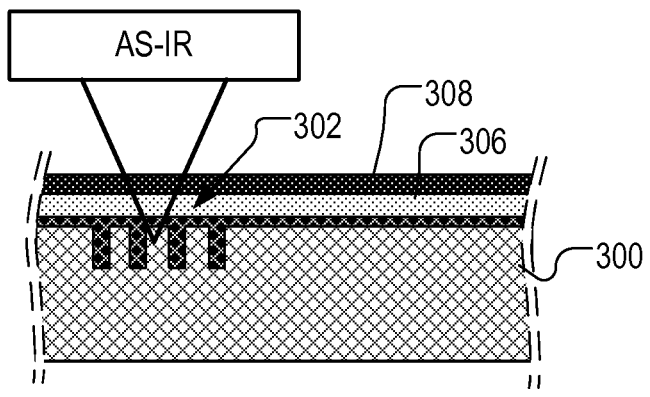
FIG. 4 illustrates schematically a method of determining the position of a target structure in a first embodiment of the invention using a position sensor having longer wavelength radiation.

FIG. 4 illustrates an alternative solution, based on using a position sensor AS-IR that uses a much longer wavelength of radiation that can penetrate the opaque layer 308. The known alignment sensor, currently operates at wavelengths between 500 nm and 900 nm. While this wavelength range includes infrared wavelengths near to the visible range, these are unable to penetrate common opaque layers, such as Carbon hard masks used for 3D-NAND devices. The inventors have recognized that transmission through amorphous Carbon is relatively high for longer IR wavelengths, making it interesting to introduce a position sensor that can operate for example using radiation of wavelengths longer than 1000 nm, for example in the range between 1500 nm and 2500 nm.

The alignment sensor AS-IR in FIG. 4 is therefore one capable of using these longer infrared wavelengths. The mark 302 in FIG. 4 is shown as being the same as the mark 302 in FIG. 3, but it may also be a special mark with, for example a longer grating pitch, which is better adapted to measurements with these longer wavelengths. While the existing alignment sensor handles multiple wavelengths of visible and near-infrared radiation in a common optical system, it is not straightforward to combine both these wavelengths and longer infrared wavelengths in the same optical system. A particular challenge is in the design of the antireflective coatings that are in practice required on the many surfaces and interfaces between elements in the optical system, including the self-referencing interferometer. Other components, for example half wave plates and quarter wave plates, are challenging to design for such a wide range of wavelengths such as between 500 nm and 2500 nm. Without effective coatings and other elements, contrast in the position signals will be lost and position sensing ability, or at least position sensing accuracy, will be degraded.

To provide a completely separate optical system for the longer wavelengths would greatly increase the cost of the apparatus, even if space for it would be available within a lithographic tool (or other operating environment where a position sensor may be required). The cost of providing a dedicated infrared position sensor could be disproportionate to the benefit gained, when only a minority of products and layers will require it.

Figure 5:
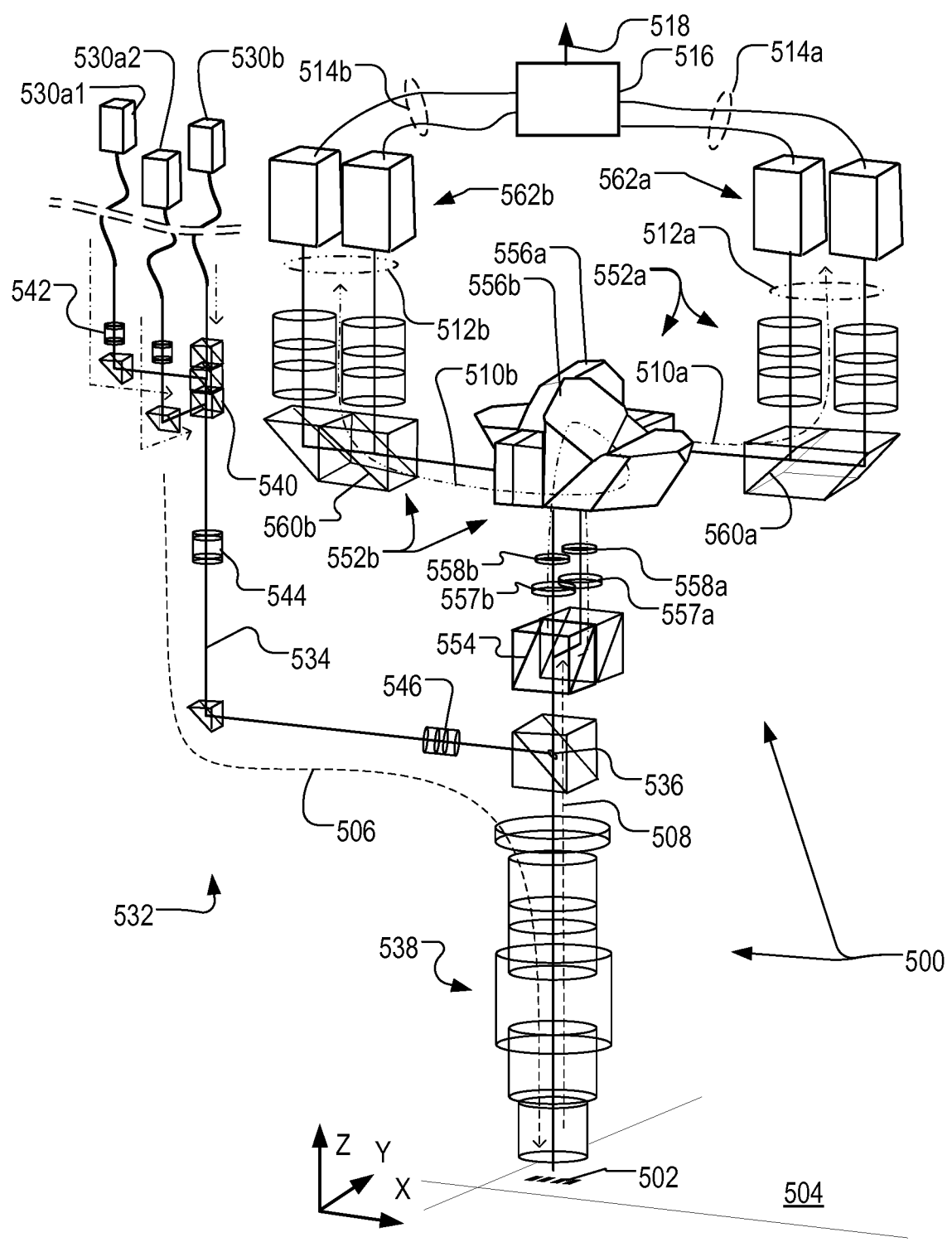
FIG. 5 illustrates schematically the optical system of a position sensor according to a first embodiment of the present invention.

As seen in the example of FIG. 5, a position sensor according to one example of the present disclosure is used as an alignment sensor to measure the position of an alignment mark 502 on a substrate 504. The position sensor comprises an optical system 500 operable to deliver, collect and process radiation in a first wavelength range (waveband) and in a second wavelength range (waveband), to obtain position signals from the alignment mark. The first waveband may be for example the visible and/or near infrared waveband similar to the existing alignment sensors.

The optical system is configured to deliver radiation to alignment mark 502 along a common illumination path (indicated by dashed line 506), to collect diffracted or scattered radiation from the substrate along a common collection path (indicated by dashed line 508), and to process the collected radiation of the first waveband and the second waveband in separate processing paths 510*a* (indicated by single dot-dash line 510*a* and double dot-dash line 510*b*, respectively). The optical system in each processing path 510*a*, 510*b* is operable to derive at least one position-sensitive signal 512*a*, 512*b* as the alignment mark 502 moves relative to the optical system 500. The signals labeled 512*a*, 512*b* are optical signals in this example, eventually converted to electrical signals 514*a*, 514*b* and processed by a processor 516 to produce one or more position measurements 518.

Detail of the construction and operation of such an alignment sensor can be found in the prior patent publications mentioned in the introduction, and will not be repeated here. Briefly, in the illumination path 506 there are provided a plurality of individual wavelength sources such as LEDs or laser sources. Sources 530a1, 530a2 are arranged to supply different wavelengths of radiation in the first waveband, for example green and red visible light, as in the known apparatus. In addition to these red and green wavelengths, near infrared wavelengths may also be provided by additional sources and multiplexers (not shown), as in the known apparatus. These different wavelengths may be polarized differently, to improve diversity of detection capability without increasing the number of sources or using moving parts. For example in the example described in US2015355554A1, four wavelengths in the visible/near infrared waveband (500-900 nm) are labelled R, G, N and F. R and F have a first polarization direction, while G and N have a second polarization direction, orthogonal to the first one. Source 530b is arranged to supply radiation in the second waveband, for example infrared radiation in the range of 1500-2500 nm, optionally including a wavelength having a wavelength longer than 2000 nm. Additional sources can be provide in one or both of the wavebands, according to the required performance and expected operating conditions. The sources in each waveband may be narrowband sources or broadband sources, and may be fixed frequency or tunable, coherent or incoherent. Although separate sources are shown, it is also possible that some or all of these wavelengths are derived from a single, broadband source and divided into different wavelength ranges within one or both of the first and second wavebands. Sources can includes lasers, gas discharge sources, plasma sources, supercontinuum sources and inverse Compton scattering sources. A single source may be switchable between the different wavelengths, so that the different wavelengths within one or both of the first and second wavebands are multiplexed over time, rather than by filters.

Whatever the source type, radiation of both wavebands is combined in an illumination sub-system 532 to form a single beam 534 following a common illumination path 506. The sources may or may not operate simultaneously, but the common illumination sub-system allows a compact construction within the housing of the position sensor, and within the lithographic tool LA or other apparatus. Beam 534 is deflected by a spot mirror 536 into an objective lens 538, which focuses the beam into a spot on the alignment target 502. Illumination sub-system 532 in this example includes a stack of dichroic mirrors 540 for diverting each wavelength of radiation into the beam 534. Lenses 542, 544 are provided which cooperate with objective lens 538 for conditioning the beam and focusing the spot. Also in the illumination sub-system a half-wave plate 546 or a quarter-wave plate is provided to give the illumination polarization characteristics suitable for processing in a self-referencing interferometer.

Radiation reflected and diffracted by the alignment mark 502 is collected by the objective lens 538 into collection path 508. While the collected radiation is illustrated as a single beam on the optical axis, this information carrying beam is actually spread out by scattering and diffraction. An axial component representing zero-order reflection is blocked by the spot mirror 536, which thus acts as an aperture stop. The collected radiation is then split into two separate paths according to its wavelength, so that radiation of the first waveband (dot-dash line 510a) will enter a first processing sub-system 552a and radiation of the second waveband (double dot-dash line 510b) will enter a second processing sub-system 552b.

The nature of the processing sub-systems will depend on the desired performance and the type of mark provided. The processing sub-systems may be based on interferometry, or on imaging, or on a combination of techniques. The sub-systems may be substantially the same type as one another, or they may be completely different types. In the present example, it will be assumed that both the first and second processing sub-systems are based on interferometry, and comprise self-referencing interferometers of the type described in the references.

The radiation of different wavebands is split in this example by a spectral filter 554, comprising a dichroic mirror reflecting surface tuned to transmit (for example) the visible (and optionally near infrared) wavelengths of the first waveband and to reflect (for example) the longer infrared radiation of the second waveband. Instead of a dichroic filter, a movable filter and/or mirror elements may be provided to switch the radiation into whichever path is to be used for a current measurement. However, such an arrangement will not permit measurements in both wavebands to be made simultaneously. It will also be understood that moving parts can bring problems of cost, volume, accuracy, reliability and vibration.

Within each processing sub-system 552a, 552b, a self-referencing interferometer 556a, 556b receives the collected radiation via a respective aperture stop (pupil filter) 557a, 557b. The purpose of these is to control of which portions of the reflected and diffracted radiation are admitted into the processing sub-system, additional to any spatial filtering provided by the spot mirror and natural aperture of the objective. A pupil filter could alternatively or additionally be provided in the common path, if desired, between the spot mirror and the dichroic filter. Providing separate aperture stops 557a, 557b for the different wavebands allows more flexibility in tailoring the aperture to the different wavelengths and diffraction angles.

At the entrance of each interferometer a half-wave plate 558a, 558b conditions the polarization of the radiation to 45 degrees. The interferometer then processes it in the manner described in the references, interfering the beam with a rotated copy of itself so that opposite diffraction orders interfere constructively and destructively. Polarizing beam splitters 560a, 560b separate "sum" and "difference" channels, which provide the position-sensitive optical signals 512a, 512b to a detection sub-system 562a, 562b. Each detection sub-system includes for each of the sum and difference channels, photodetectors for obtaining the desired electrical position signals 518a and 518b. Where the waveband contains multiple wavelengths, then wavelength demultiplexers are included in the detection sub-system, and individual photodetectors are provided to obtain an electrical signal 518a, 518b for each wavelength. Optical fibers can be used to route the optical signals away to a more convenient location for demultiplexing and/or detection. In front of each optical fiber the detection sub-systems may include a field stop to restrict the field of view of the optical system.

In the same way as described for the detection sub-systems, the sources 530a1, 530a2, 530b etc. may be located remotely, using optical fibers or other suitable light guides, as illustrated already in FIG. 5.

In summary of this example, it will be appreciated that the infrared wavelengths and the shorter visible/near infrared wavelengths share a common illumination path 506 and collection path 508, including a common objective lens 538. The radiation from different sources is firstly combined with dichroic mirrors 540 and separated after the objective lens 538 with a dichroic mirror 554. The only optics that both wavelength channels have in common is the spot mirror 536, the objective lens 538, and optionally a pupil filter 550. These components should therefore be made compatible for both wavelength ranges. In the same optical system, however, separate channels dedicated to the first and second wavebands can use their own dedicated fibers, polarization optics (e.g. half-wave plates 558a, 558b), interferometers (556a, 556b). Each of these components can be optimized in design for the specific waveband, and therefore its performance can be improved.

It will be understood that objective lens may have a wavelength-dependent focal depth, which might mean that both wavelength ranges cannot be used at the same time in parallel. This may not be problematic, although it might increase measurement time, if measurements in both wavebands are desired on a given alignment mark. In the present example, a separate optical system is used for focus control. This is conventional and need not be described herein.

Figure 6:
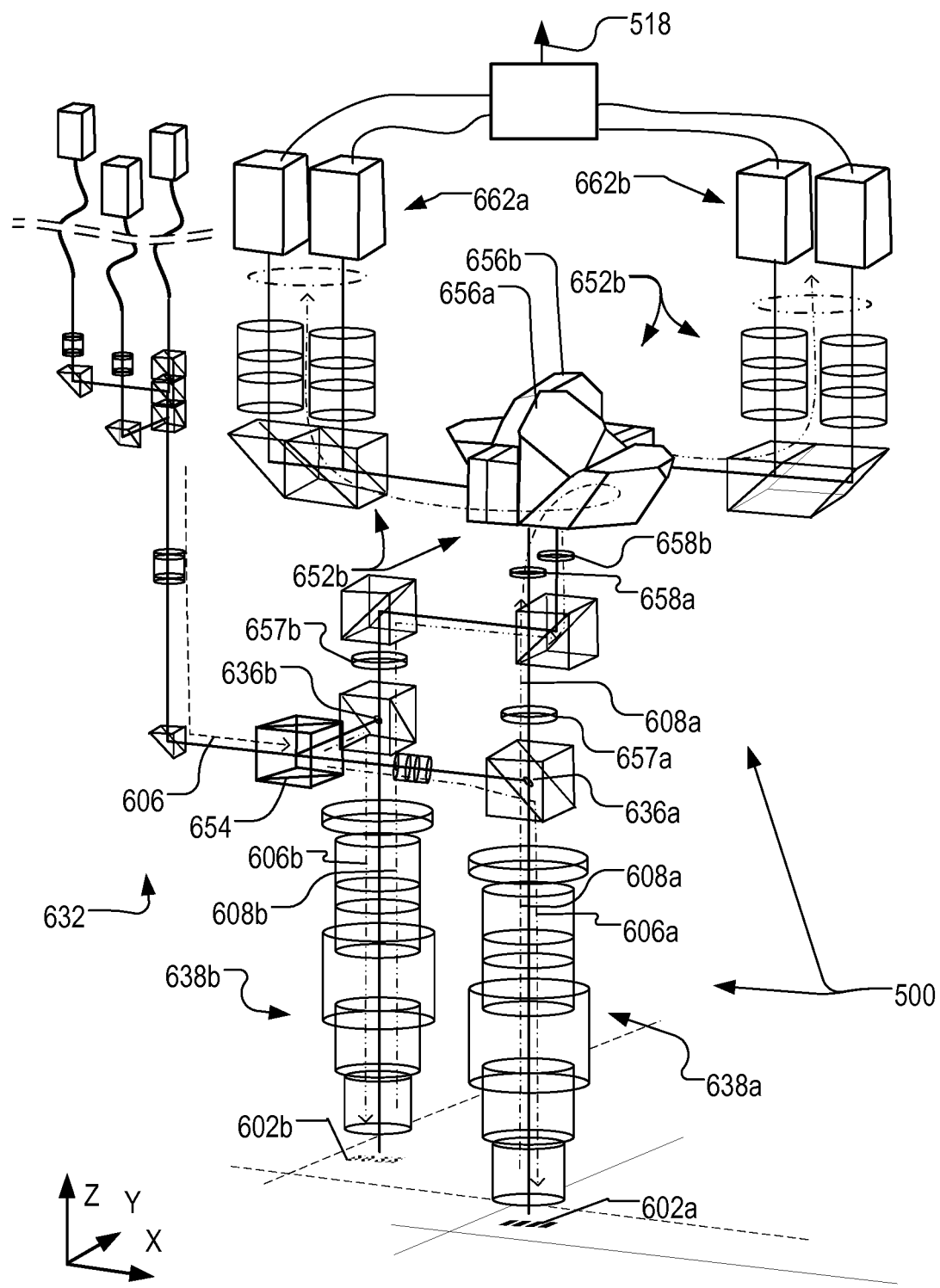
FIG. 6 illustrates schematically the optical system of a position sensor according to a second embodiment of the present invention.

FIG. 6 illustrates a second example, in which like components have reference signs similar to the example of FIG. 5, but with prefix '6' instead of '5'. Only the main components and sub-systems are labeled. In this example, two spot mirrors 636a, 636b and two objective lenses 638a, 638b are provided, downstream of spectral filter 654. In this example, each objective lens can be optimized for one of the wavebands, rather than having to compromise to obtain acceptable performance over the full extent of both wavebands. Since there are two objective lenses, the radiation will be focused at different positions in the two different wavebands. Therefore an alignment mark should be at a first position labeled 602a for measuring with radiation in the first waveband, and at a second position labeled 602b for measuring with radiation in the second waveband. If this is the same mark, then it cannot be measured simultaneously in both wavebands. Different marks may be provided in any case, for measurement using the infrared radiation.

In both of the above examples, the radiation of the first waveband and the second waveband share a common optical path in at least some portion of the optical system, while the radiation of the first wavelength range is processed by a first processing sub-system and the radiation of the second wavelength range is processed by a second processing sub-system. In the example of FIG. 5, the optical system includes an illumination system for combining radiation of both the first and second wavelength ranges from a plurality of radiation sources into the common optical path and the common optical path further includes a common objective lens for delivering and collecting said radiation of both wavebands. In the example of FIG. 6, on the other hand, the optical system includes a first objective lens for delivering and collecting radiation of the first waveband and a second objective lens for delivering and collecting radiation of the second waveband.

The illustrated examples are only two of many possible implementations within the principles of the present disclosure. The principles of the present disclosure can be applied to other types of processing sub-system, not only those with self-referencing interferometers, or interferometers more generally. The wavelength ranges can be different to the examples given above. For future applications, extension of the sensing wavelengths into ultraviolet wavelengths may be considered, for example. The principles of the present disclosure can be used in combination with other techniques, including those mentioned in the prior patents and patent applications mentioned in the introduction. For example, WO2015051970A1 discloses a modification of the known position sensor to include a polarization-resolving capability. A polarizing beam splitter divides the collected radiation into two different paths, according to its polarization. Each path then has its own processing sub-system with a self-referencing interferometer. Combining that with the present disclosure, a position sensor can be envisaged with a combination of both polarizing beam splitter(s) and dichroic filter(s), and having four processing sub-systems, one for each waveband/polarization combination.

Using the position sensor in a lithographic apparatus as art of a device manufacturing method, marks can be measured using wavelengths in a first waveband for processing one layer of a device (like FIG. 3 (b)), while the same or different marks can be measured using wavelengths in the second waveband for processing another layer in the same or a different device. The selection of wavebands and individual wavelengths can be specified in recipe data, as described above with reference to FIG. 2. In this way, the control unit LACU can be programmed to use the waveband and wavelengths appropriate to each layer.

In conclusion, it has been shown how the position alignment marks, or other structures, can be measured using a much wider range of wavelengths, without providing an entirely separate optical system. The first wavelength range may include radiation with one or more wavelengths shorter than 800 nm, for example shorter than 700 nm or shorter than 600 nm. The second wavelength range can include infrared radiation with one or more wavelengths longer than 1000 nm, optionally longer than 1500 nm or longer than 2000 nm.

While specific embodiments of the invention have been described above, it will be appreciated that the invention may be practiced otherwise than as described.

While the example structures described above as marks are grating structures specifically designed and formed for the purposes of position measurement, in other embodiments, positions may be measured on structures which are functional parts of devices formed on the substrate. Many devices have regular, grating-like structures. The terms "mark" and "grating structure" as used herein do not require that the structure has been provided specifically for the measurement being performed. An opaque layer is not the only kind of overlying structure that may disrupt measurement of the position of the mark by observing the mark in conventional wavelengths. For example, surface roughness, or a conflicting periodic structure, may interfere with measurement at one or more wavelengths.

In association with the position measuring hardware and suitable structures realized on substrates and patterning devices, an embodiment may include a computer program containing one or more sequences of machine-readable instructions implementing methods of measurement of the type illustrated above to obtain information about the position of the mark covered by an overlying structure. This computer program may be executed, for example, by a processor 606 or the like which is dedicated to that purpose, or is integrated in the control unit LACU of FIG. 1. There may also be provided a data storage medium (e.g., semiconductor memory, magnetic or optical disk) having such a computer program stored therein.

In an embodiment, there is provided a position sensor comprising an optical system configured to deliver radiation to an alignment mark on a substrate and to collect diffracted or scattered radiation from the substrate, and to process the collected radiation to derive at least one position-sensitive signal therefrom, wherein the optical system is operable to deliver, collect and process radiation selectively in a first wavelength range and/or in a second wavelength range, wherein the radiation of the first wavelength range and the second wavelength range share a common optical path in at least some portion of the optical system, while the radiation of the first wavelength range is processed by a first processing sub-system and the radiation of the second wavelength range is processed by a second processing sub-system.

In an embodiment, the first wavelength range includes radiation with a wavelength shorter than 800 nm and the second wavelength range includes infrared radiation with wavelength longer than 1000 nm. In an embodiment, the second wavelength range includes infrared radiation with wavelength longer than 1500 nm. In an embodiment, the optical system includes an illumination system for combining radiation of both the first and second wavelength ranges from one or more radiation sources into the common optical path and the common optical path further includes a common objective lens for delivering and collecting the radiation of both the first and second wavelength ranges to the alignment mark, the objective lens being included in the common optical path. In an embodiment, a spectral filter is provided to split the radiation of the first and second wavelength ranges collected by the common objective lens for delivery to the first and second processing sub-systems. In an embodiment, the optical system includes a first objective lens for delivering and collecting radiation of the first wavelength range and a second objective lens for delivering and collecting radiation of the second wavelength range. In an embodiment, the optical system includes an illumination system for combining radiation of both the first and second wavelength ranges from a plurality of radiation sources into the common optical path for delivering radiation to the first and second objective lenses. In an embodiment, a spectral filter is provided to split the radiation of the first and second wavelength ranges from the common optical path for delivery to the first and second objective lenses. In an embodiment, a first half or quarter wave plate is positioned in the path of the radiation of the first wavelength range between the spectral filter and the first processing sub-system, and a second half or quarter wave plate is positioned in the path of the radiation of the second wavelength range between the spectral filter and the second processing sub-system. In an embodiment, a plurality of position-sensitive signals are obtained by processing the collected radiation in at least one of the wavelength ranges, each position-sensitive signal being obtained using radiation having different characteristics. In an embodiment, the radiation having different characteristics includes radiation having different wavelengths within the first wavelength range. In an embodiment, the radiation having different characteristics includes radiation having different wavelengths within the second wavelength range.

In an embodiment, there is provided a method of manufacturing devices wherein a device pattern is applied to a substrate using a lithographic process, the method including positioning the applied pattern by reference to measured positions of one or more marks formed on the substrate, the measured positions being obtained using a position sensor as described herein. In an embodiment, different device patterns are applied to different layers on the substrate and the measured positions are obtained using the first wavelength range for patterning a first layer and using the second wavelength range for a second layer.

In an embodiment, there is provided a lithographic apparatus for use in applying a pattern to a substrate, the lithographic apparatus including a position sensor as described herein and a controller configured for causing the position sensor to measure the position of one or more alignment marks using a radiation in a selected one or both of the wavelength ranges, and for using the measured position of the target structure to control the positioning of one or more patterns applied to the substrate.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A position sensor comprising an optical system configured to deliver radiation to an alignment mark on a substrate and to collect diffracted or scattered radiation from the substrate, and a detection system to process the collected radiation to derive at least one position-sensitive signal therefrom, wherein the optical system is configured to deliver and collect radiation in a first wavelength range and in a second wavelength range and the detection system is configured to process radiation selectively in the first wavelength range and/or in the second wavelength range, wherein the radiation of the first wavelength range and the second wavelength range share a common optical path in at least a common objective lens, the optical system configured to simultaneously deliver the radiation of both the first and second wavelength ranges via the common objective lens onto the same alignment mark and collect the diffracted or scattered radiation from the substrate, and wherein the radiation of the first wavelength range is processed by a first processing sub-system and the radiation of the second wavelength range is processed by a second processing sub-system.

2. The position sensor as claimed in claim 1, wherein the first wavelength range includes radiation with a wavelength shorter than 800 nm and the second wavelength range includes infrared radiation with a wavelength longer than 1000 nm.

3. The position sensor as claimed in claim 2, wherein the second wavelength range includes infrared radiation with a wavelength longer than 1500 nm.

4. The position sensor as claimed in claim 1, wherein the optical system includes an illumination system configured to combine radiation of both the first and second wavelength ranges from one or more radiation sources into the common optical path.

5. The position sensor as claimed in claim 1, wherein a spectral filter is provided to split the radiation of the first and second wavelength ranges collected by the optical system for delivery to the first and second processing sub-systems.

6. The position sensor as claimed in claim 5, wherein a first half or quarter wave plate is positioned in the path of the radiation of the first wavelength range between the spectral filter and the first processing sub-system, and a second half or quarter wave plate is positioned in the path of the radiation of the second wavelength range between the spectral filter and the second processing sub-system.

7. The position sensor as claimed in claim 1, wherein a plurality of position-sensitive signals are obtained by processing the collected radiation in the first and/or second wavelength range, each position-sensitive signal being obtained using radiation having different characteristics.

8. The position sensor as claimed in claim 7, wherein the radiation having different characteristics includes radiation having different wavelengths within the first wavelength range.

9. The position sensor as claimed in claim 7, wherein the radiation having different characteristics includes radiation having different wavelengths within the second wavelength range.

10. A lithographic apparatus for use in applying a pattern to a substrate, the lithographic apparatus including the position sensor as claimed in claim 1 and a controller configured to at least cause the position sensor to measure the position of one or more alignment marks using radiation in a selected one or both of the first and second wavelength ranges, and use the measured position of the target structure to control the positioning of one or more patterns applied to the substrate.

11. A method comprising:
simultaneously providing radiation of both a first wavelength range and a second wavelength range onto a same alignment mark on a substrate via a common objective lens of an optical system;
collecting diffracted or scattered radiation from the substrate; and
processing the collected radiation to derive at least one position-sensitive signal therefrom, wherein the collected radiation of the first wavelength range is processed by a first processing sub-system and the collected radiation of the second wavelength range is processed by a second processing sub-system.

12. The method as claimed in claim 11, wherein the first wavelength range includes radiation with a wavelength shorter than 800 nm and the second wavelength range includes infrared radiation with a wavelength longer than 1000 nm.

13. The method as claimed in claim 12, wherein the second wavelength range includes infrared radiation with a wavelength longer than 1500 nm.

14. The method as claimed in claim 11, further comprising using a spectral filter to split the radiation of the first and second wavelength ranges collected by the optical system for delivery to the first and second processing sub-systems.

15. The method as claimed in claim 14, further comprising using a first half or quarter wave plate positioned in the path of the radiation of the first wavelength range between the spectral filter and the first processing sub-system, and using a second half or quarter wave plate positioned in the path of the radiation of the second wavelength range between the spectral filter and the second processing sub-system.

16. The method as claimed in claim 11, further comprising obtaining a plurality of position-sensitive signals by processing the collected radiation in the first and/or second wavelength range, each position-sensitive signal being obtained using radiation having different characteristics.

17. The method as claimed in claim 16, wherein the radiation having different characteristics includes radiation having different wavelengths within the first wavelength range.

18. The method as claimed in claim 16, wherein the radiation having different characteristics includes radiation having different wavelengths within the second wavelength range.

19. A method of manufacturing devices wherein a device pattern is applied to a substrate using a lithographic process, the method including positioning the applied pattern by reference to measured positions of one or more marks formed on the substrate, the measured positions being obtained using the method of claim 11.

20. The method as claimed in claim 19, wherein different device patterns are applied to different layers on the substrate, and wherein the measured positions are obtained using the first wavelength range for patterning a first layer and using the second wavelength range for a second layer.

* * * * *